(12) United States Patent
Cheng et al.

(10) Patent No.: US 9,245,857 B2
(45) Date of Patent: *Jan. 26, 2016

(54) CHIP PACKAGE

(71) Applicant: Novatek Microelectronics Corp., Hsinchu (TW)

(72) Inventors: Jhih-Siou Cheng, New Taipei (TW); Tzu-Chiang Lin, Hsinchu (TW); Chia-En Wu, New Taipei (TW); Chun-Yung Cho, Hsinchu County (TW); Cheng-Hung Chen, Hsinchu County (TW); Ju-Lin Huang, Hsinchu County (TW)

(73) Assignee: Novatek Microelectronics corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/726,613

(22) Filed: Jun. 1, 2015

(65) Prior Publication Data

US 2015/0262943 A1 Sep. 17, 2015

Related U.S. Application Data

(63) Continuation of application No. 13/674,903, filed on Nov. 12, 2012, now Pat. No. 9,048,243.

(30) Foreign Application Priority Data

Jun. 27, 2012 (TW) .............................. 101123020 A (51) Int. Cl.
*H01L 23/12* (2006.01)
*H01L 23/48* (2006.01)
(Continued)

(52) U.S. Cl.
CPC ............ *H01L 23/60* (2013.01); *H01L 23/5389* (2013.01); *H01L 24/17* (2013.01);
(Continued)

(58) Field of Classification Search
CPC ................. H01L 2224/48227; H01L 23/5389; H01L 25/0655; H01L 25/0657; H01L 25/0753
USPC .................. 257/700, 737, 774, 778, E21.499, 257/E21.5, E21.506, E21.511
See application file for complete search history.

(56) References Cited

U.S. PATENT DOCUMENTS

2003/0235019 A1 12/2003 Ker et al.
2005/0205887 A1* 9/2005 Shei ...................... H01L 25/167
257/99

(Continued)

FOREIGN PATENT DOCUMENTS

CN 1466210 1/2004
CN 201956679 8/2011

OTHER PUBLICATIONS

"Office Action of Taiwan Counterpart Application", issued on Aug. 6, 2015, p1-p4, in which the listed references were cited.

(Continued)

*Primary Examiner* — Mohsen Ahmadi
(74) *Attorney, Agent, or Firm* — Jianq Chyun IP Office (57) ABSTRACT

A chip package structure includes a package body. The package body includes a core circuit and an electrostatic discharge protection circuit. A first connection terminal electrically is connected to the core circuit. A second connection terminal electrically is connected to the electrostatic discharge protection circuit. A first interconnection structure electrically connected to the electrostatic discharge protection circuit, the second connection terminal and a third connection terminal. A first lead electrically connects the second connection terminal and an external circuit. A second lead electrically connects the first connection terminal and the third connection terminal. The second lead and the first lead are substantially separate.

19 Claims, 8 Drawing Sheets

(51) Int. Cl.
*H01L 23/52* (2006.01)
*H01L 23/40* (2006.01)
*H01L 23/60* (2006.01)
*H01L 23/538* (2006.01)
*H01L 25/065* (2006.01)
*H01L 23/00* (2006.01)
*H02H 9/02* (2006.01)

(52) U.S. Cl.
CPC ............ *H01L25/0655* (2013.01); *H02H 9/02* (2013.01); *H01L 2224/16137* (2013.01); *H01L 2224/16195* (2013.01)

(56) References Cited

U.S. PATENT DOCUMENTS

| | | |
|---|---|---|
| 2006/0139893 A1 | 6/2006 | Yoshimura et al. |
| 2008/0204091 A1 | 8/2008 | Choo et al. |
| 2009/0154038 A1 | 6/2009 | Dunnihoo et al. |
| 2010/0258891 A1* | 10/2010 | Jow .................. G06K 9/00006 257/433 |
| 2010/0321842 A1 | 12/2010 | Gebreselasie et al. |

OTHER PUBLICATIONS

"Office Action of China Counterpart Application", issued on Oct. 9, 2015, pp. 1-5.

* cited by examiner

FIG. 8

CHIP PACKAGE

CROSS-REFERENCE TO RELATED APPLICATION

This application is a continuation application of and claims the priority benefit of a prior application Ser. No. 13/674,903, filed on Nov. 12, 2012, now allowed. The prior application Ser. No. 13/674,903 claims the priority benefit of Taiwan application serial no. 101123020, filed on Jun. 27, 2012. The entirety of each of the above-mentioned patent applications is hereby incorporated by reference herein and made a part of this specification.

BACKGROUND OF THE INVENTION

1. Field of the Invention

The invention relates to a chip package technology, and more particularly to a chip package having a lead structure capable of reducing electrostatic damage.

2. Description of Related Art

A packaging process is needed after a manufacturing process of an integrated circuit to package a core circuit into a chip with only a lead exposed for connecting an external circuit.

A variety of package technologies are available nowadays. For example, chip on film (COF) package technology is the latest trend. A lead for COF is a film lead. A connection terminal of an integrated circuit is, for example, a bumping pad which is electrically connected to the external circuit via the film lead.

Figure 1:
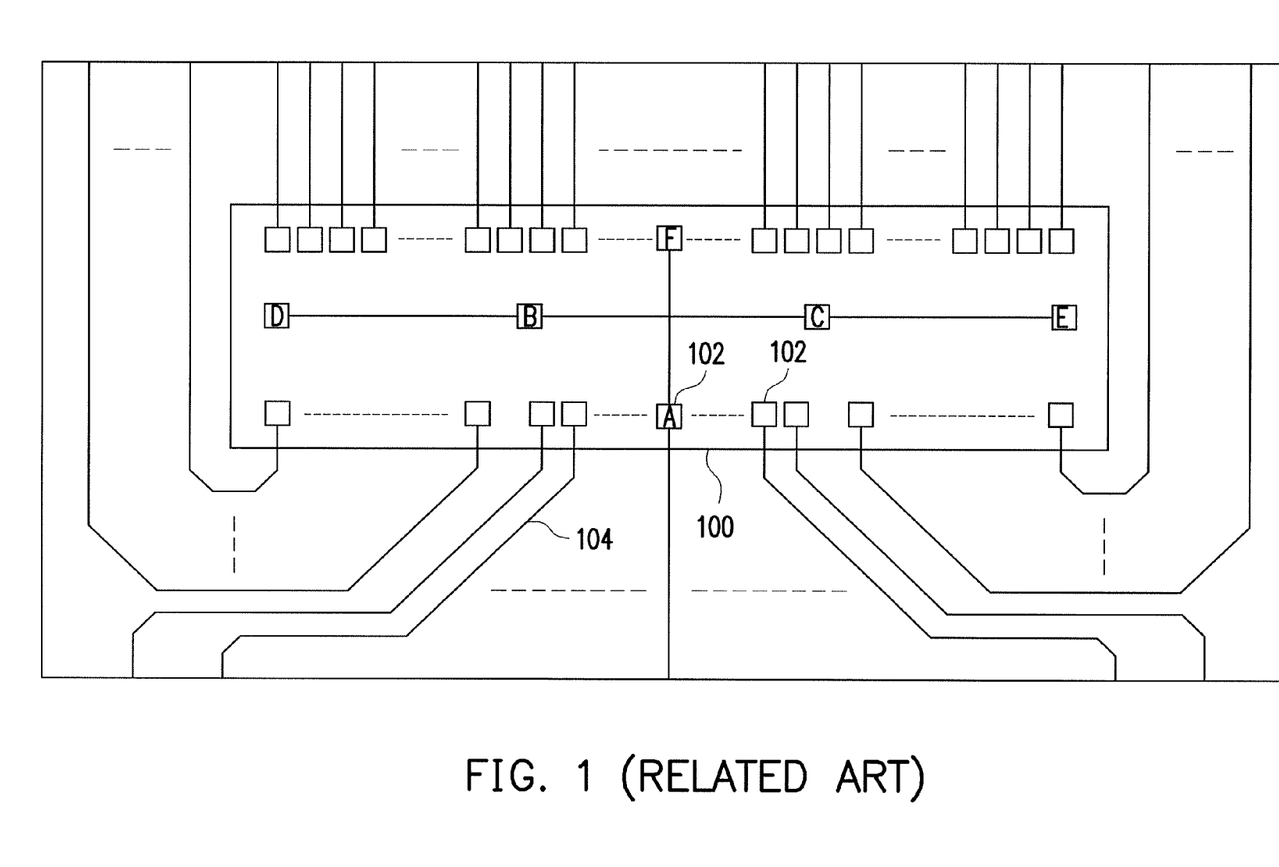
FIG. 1 is a top schematic view of a connection structure between a bumping pad and a film lead of a conventional COF package.

In FIG. 1, a top schematic view of a connection structure between a bumping pad and a film lead of the conventional COF package is illustrated. Referring to FIG. 1, a plurality of bumping pads 102 is configured on a package body 100 of a chip. Each connection terminal 102 connects outwardly via a film lead 104. For example, the connection terminals 102 denoted by A, B, C, D, E, and F are connected by the same piece of the film lead 104, which is, for example, generally a lead for supplying power.

In general designs, since electrostatic discharge (ESD) is taken into consideration, each connection terminal 102 needs to have an electrostatic discharge protection circuit underneath, and one film lead 104 is likely to correspond to a plurality of the connection terminals 102. That is, a plurality of electrostatic discharge protection circuits is required. As a result, the area of an integrated circuit is occupied by the electrostatic discharge protection circuits and can not be effectively used.

SUMMARY OF THE INVENTION

The invention provides a chip package structure, which is capable of reducing the quantity of electrostatic discharge protection circuits while maintaining an electrostatic discharge protection effect.

An embodiment of the invention provides a chip package structure, which includes a package body. The package body includes a core circuit and an electrostatic discharge protection circuit. A first connection terminal electrically is connected to the core circuit. A second connection terminal electrically is connected to the electrostatic discharge protection circuit. A first interconnection structure electrically connected to the electrostatic discharge protection circuit, the second connection terminal and a third connection terminal. A first lead electrically connects the second connection terminal and an external circuit. A second lead electrically connects the first connection terminal and the third connection terminal. The second lead and the first lead are substantially separate.

An embodiment of the invention provides a chip package structure. The chip package structure includes a package body. The package body includes at least one first connection terminal electrically connected to a core circuit via a first interconnection structure. Further, at least one second connection terminal electrically connected to an electrostatic discharge protection circuit via a second interconnection structure. A third connection terminal is electrically connected to the second interconnection structure. A first lead is electrically connected to the second connection terminal for connecting an external circuit. A second lead is substantially separated from the first lead, electrically connecting the third connection terminal and the first connection terminal.

An embodiment of the invention provides a chip package structure. The chip package structure includes a first chip; a second chip; an inner lead electrically connecting to the first chip and the second chip; and an outer lead electrically connecting one of the first chip and the second chip to an external circuit. The inner lead and the outer lead are substantially separate in structure. At least one of the first chip and the second chip comprises a package body includes: a core circuit; an electrostatic discharge protection circuit; a first connection terminal electrically connected to the core circuit; a second connection terminal electrically connected to the electrostatic discharge protection circuit and the outer lead; a third connection terminal, wherein the inner lead electrically connects the first connection terminal and the third connection terminal; and a first interconnection structure electrically connected to the electrostatic discharge protection circuit, the second connection terminal and the third connection terminal.

In order to make the aforementioned features and advantages of the invention more comprehensible, embodiments accompanying figures are described in detail below.

DESCRIPTION OF EMBODIMENTS

According to the embodiments of the invention, by a method of coordinating the routing inside an integrated circuit with a lead, one lead only requires one set of ESD protection circuits, so as to achieve effective use of the area of the integrated circuit and maintain the capability of ESD. The invention is applicable to chip on film package or to other compatible package structures.

Figure 2:
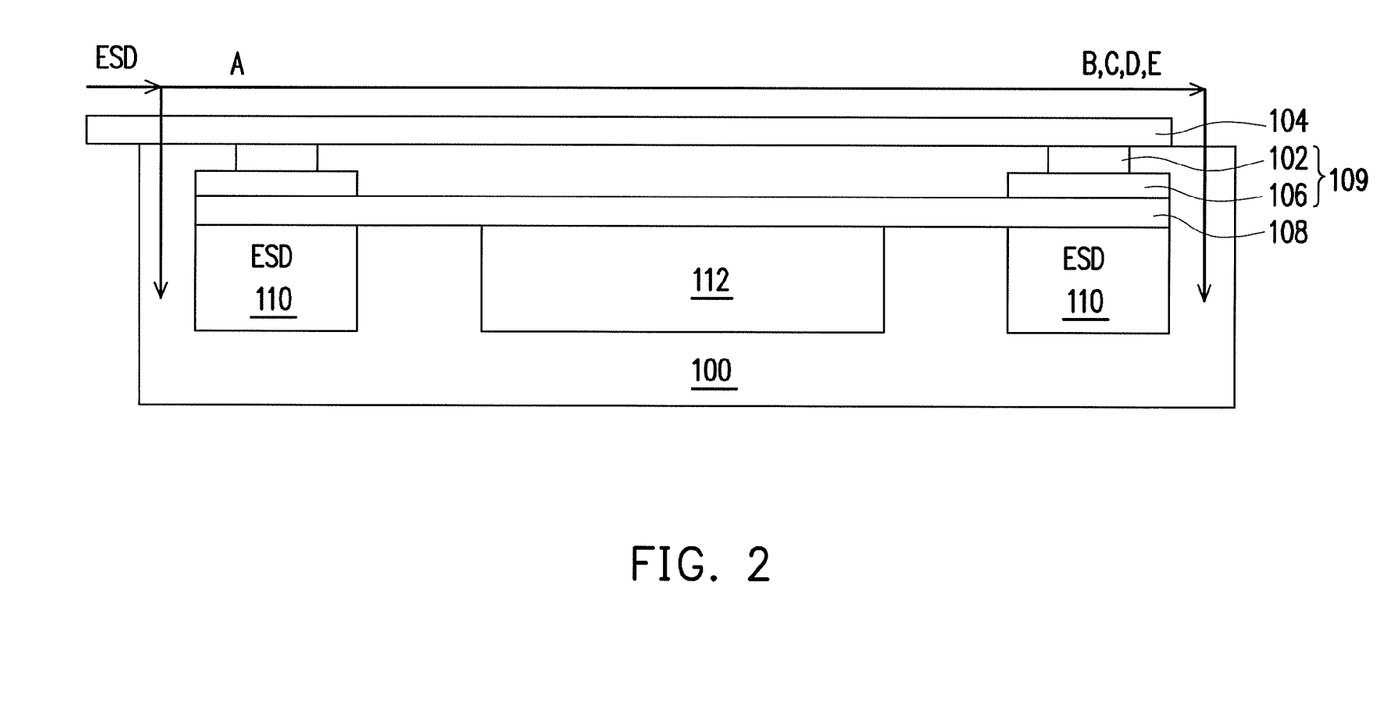
FIG. 2 is a cross-sectional schematic view of a conventional chip package structure discussed in the invention.

First of all, the invention discusses about an ESD phenomenon in conventional chip package structures. In FIG. 2, a cross-sectional schematic view of a conventional chip package structure discussed in the invention is illustrated.

With reference to FIG. 2, the chip package structure in FIG. 1 is used as an example. The chip package body 100 has a core circuit 112, an ESD protection circuit 110, a connection terminal 109, and an interconnection structure 108 therein. The connection terminal 109 includes a connection pad 106 and a bump, which is also referred to as a bumping pad. The structure in FIG. 1 is used as an example. The interconnection structure 108 connects to the ESD protection circuit 110 and the core circuit 112. The same lead 104 is electrically connected to a plurality of the connection terminals 109. For example, the lead 104 extends from the connection terminal 109 denoted by A to the connection terminals 109 denoted by B, C, D, E, or F.

Under the package structure in FIG. 2, for example, when ESD occurs at the connection terminal 109 denoted by A, a current path of ESD as indicated by an arrow line enters the ESD protection circuit 110 at the same time, such that the damage to the core circuit 112 caused by ESD can be avoided. However, a plurality of ESD protection circuits 110 is needed. Although the number of the ESD protection circuits 110 can be decreased to increase the area of an integrated circuit, the core circuit 112 is likely to be damaged by ESD, as shown in FIG. 3.

Figure 3:
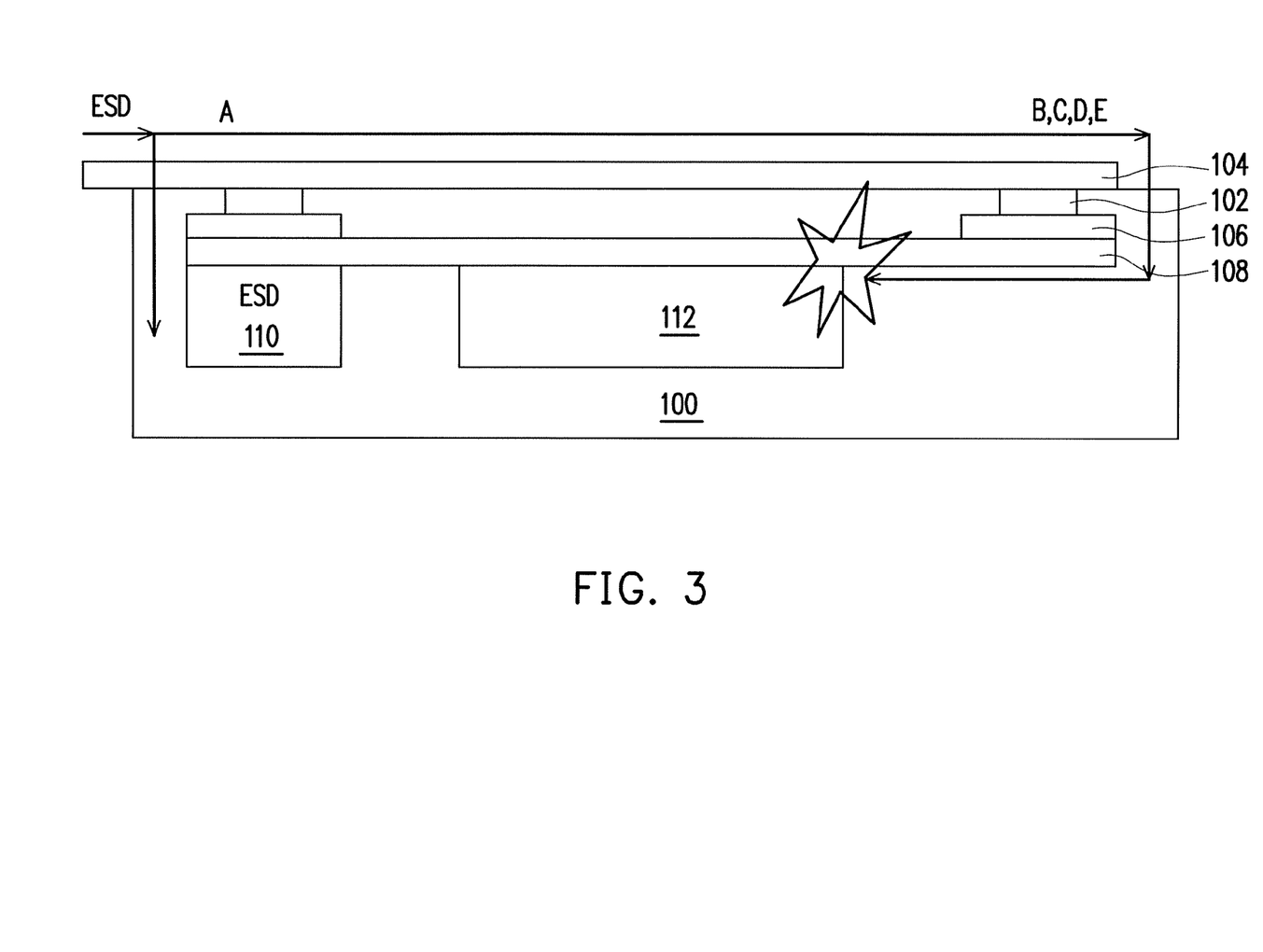
FIG. 3 is a cross-sectional schematic view of a conventional chip package structure discussed in the invention.

In FIG. 3, a cross-sectional schematic view of a conventional chip package structure discussed in the invention is illustrated. With reference to FIG. 3, the package structure in FIG. 2 is used as a basis with the ESD protection circuit 110 corresponding to the plurality of connection terminals 109 denoted by B, C, D, E, or F being removed; an ESD current consequently enters the core circuit 112, which is likely to cause damage to the core circuit 112. With the package structure in FIG. 2 as an example, the ESD protection circuit 110 below the connection terminal 109 is therefore necessary and the area inevitably taken by the ESD protection circuit 110 cannot be spared.

In the following paragraphs, the invention provides embodiments to describe a packaging method in which an ESD protection effect can be maintained when the quantity of the ESD protection circuits 110 is decreased, although the invention is not limited thereto.

Figure 4:
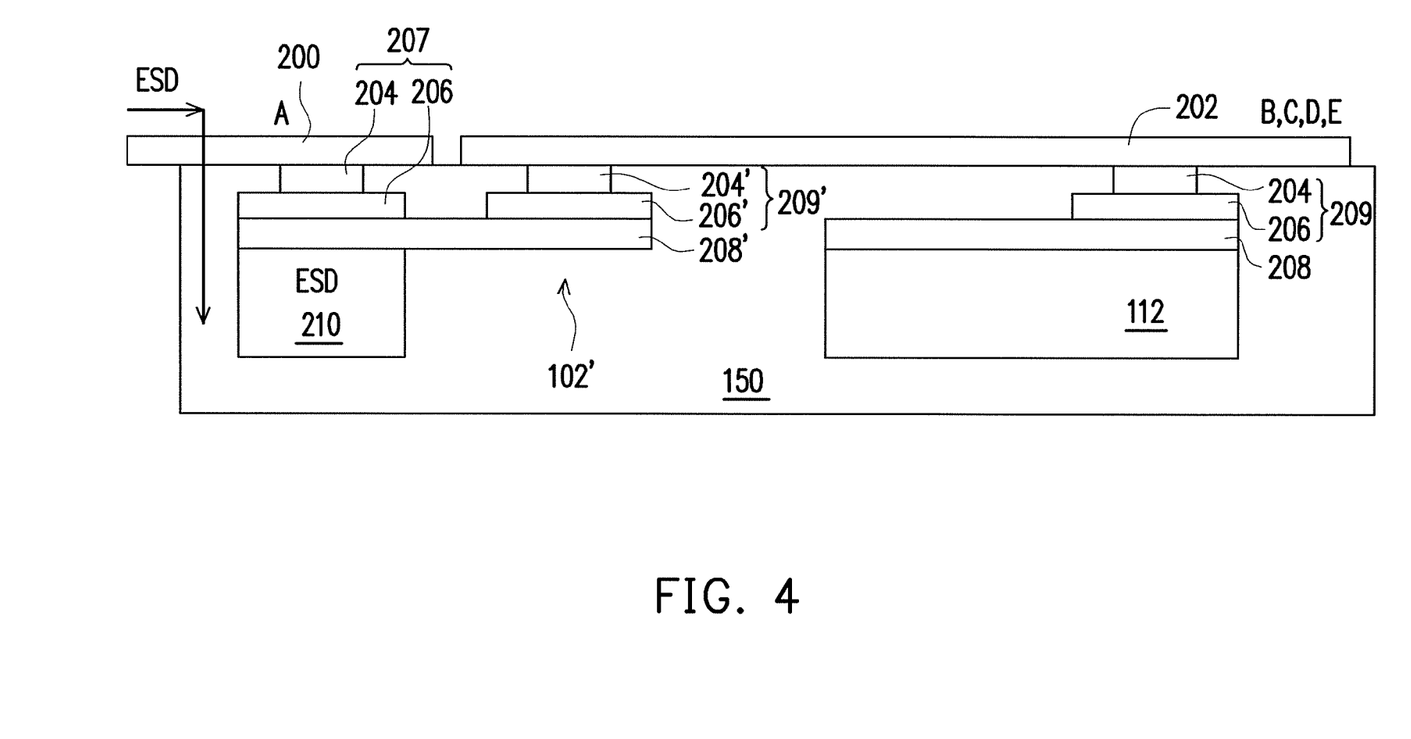
FIG. 4 is a cross-sectional schematic view of a chip package structure according to an embodiment of the invention.

In FIG. 4, a cross-sectional schematic view of a chip package structure according to an embodiment of the invention is illustrated. With reference to FIG. 4, a chip package structure includes a package body 150, a first lead 200, and a second lead 202. Elements embedded inside the package body 150 include a core circuit 112 having at least one connection terminal 209 thereon, at least one electrostatic discharge (ESD) protection circuit 210 having at least one second connection terminal 207 thereon, at least one third connection terminal 209', and at least one interconnection structure 208'. The connection terminals 207, 209 and 209', for example, generally include a connection pad 206 and a bump 204 respectively. The connection pad 206 is completed by a circuit via an interconnection structure 208 or the interconnection structure 208'. The bump 204 is formed on the connection pad 206 and a connection pad 206' during the packaging process.

The interconnection structure 208' of the embodiment of the invention electrically connects the second connection terminal 207 disposed corresponding to the ESD protection circuit 210 and the independent third connection terminal 209'. The third connection terminal 209' is not directly electrically connected to the core circuit 112. That is, the third connection terminal 209' and the core circuit 112 are separate in structure. The second connection terminal 207 is electrically connected to the third connection terminal 209' via the interconnection structure 208' thereinside. The interconnection structure 208' in the embodiment is not directly electrically connected to the core circuit 112 either.

The first lead 200 is configured on the package body 150 and is electrically connected to the second connection terminal 207 and an external circuit (not shown), but the external circuit is represented by an entering path of ESD. The second lead 202 is configured on the package body 150 and electrically connects the first connection terminal 209 on the core circuit 112 and the independent third connection terminal 209'.

It should be noted that, the second lead 202 and the first lead 200 are separate in structure. An ESD current that enters the ESD protection circuit 210 via the first lead 200 does not directly enter the core circuit 112, but passes through the ESD protection circuit 210 first. Then the remaining ESD current or a signal that operates no tally enters the core circuit 112 via the third connection terminal 209' and the second lead 202. Therefore, in actuality the connection terminal 209 connected by the second lead 202 and the first lead 200 needs only one ESD protection circuit 210, although a plurality of ESD protection circuits may be used depending on actual demands for the capability of ESD.

The third connection terminal 209' of the embodiment is electrically connected to the interconnection structure 208', to form a structurally independent relay connection structure 102'.

Figure 5:
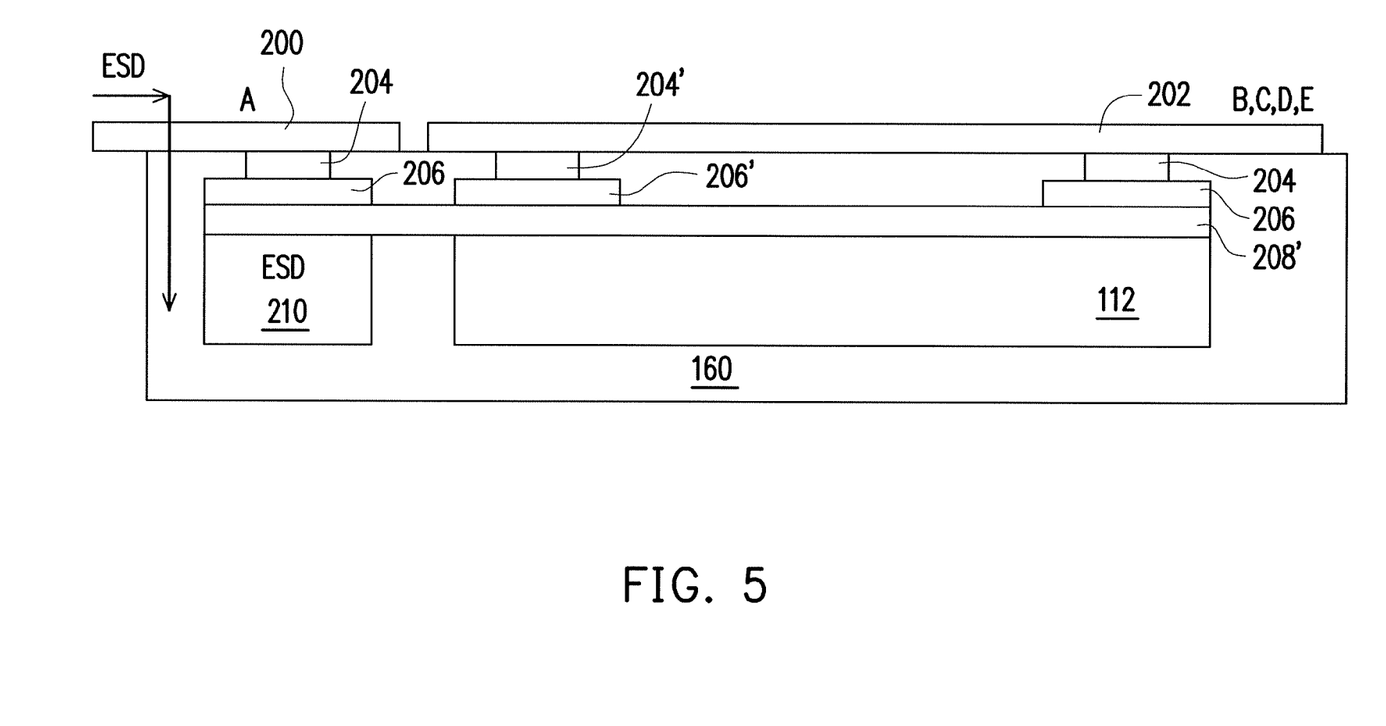
FIG. 5 is a cross-sectional schematic view of a chip package structure according to an embodiment of the invention.

Based on the same technical concept as that of the relay connection structure 102', the third connection terminal 209' may not be independent. In FIG. 5, a cross-sectional schematic view of a chip package structure according to an embodiment of the invention is illustrated.

Referring to FIG. 5, which is a variation to the embodiment in FIG. 4, the difference is that the interconnection structure 208' inside the package body 160 is, for example, also connected to the core circuit 112. The interconnection structure 208' is, for example, electrically connected to the connection terminal 209 denoted by A, B, C, D and E and is also electrically connected to the third connection terminal 209'. In other words, the connection terminal 209' can also be the connection terminal 209 on the core circuit 112. Under the structure, the second lead 202 and the first lead 200 are still separate structures. The ESD current passes mainly through the ESD protection circuit 210 without entering the core circuit 112.

Figure 6:
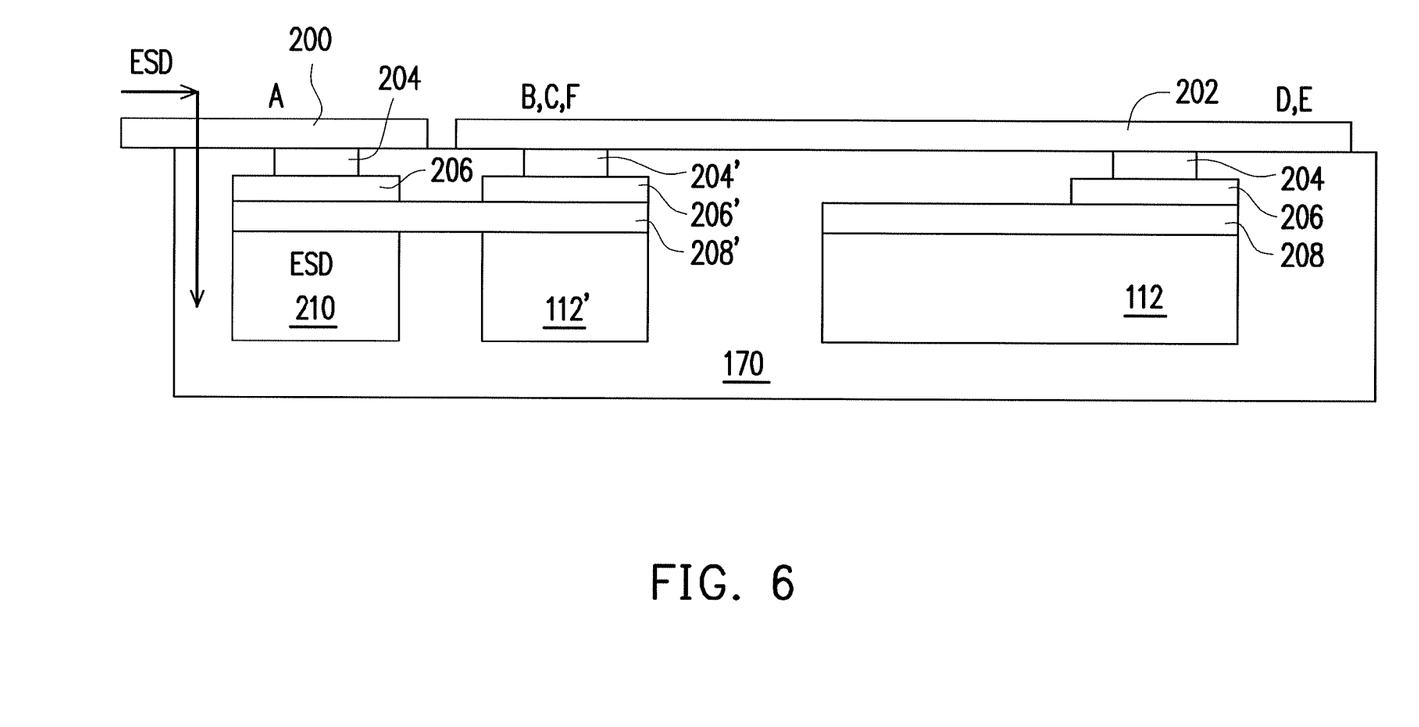
FIG. 6 is a cross-sectional schematic view of a chip package structure according to an embodiment of the invention.

In FIG. 6, a cross-sectional schematic view of a chip package structure according to an embodiment of the invention is illustrated. Referring to FIG. 6, another variation to the chip package structure is that the connection terminal 209' inside a package body 170 is also a connection terminal for another core circuit 112' and is electrically connected via the interconnection structure 208' while electrically connected to the core circuit 112 via the second lead 202. Under the structure, the second lead 202 and the first lead 200 are still separate structures. The ESD current passes mainly through the ESD protection circuit 210 without entering the core circuits 112 and 112'.

From another perspective, to classify connection terminals, basically the connection terminals can be classified into the connection terminal 207 for the ESD protection circuit 210 and the connection terminals 209 and 209' on the core circuits 112 and 112'.

In other words, a chip package structure includes a package body, a first lead, and a second lead. Elements embedded inside the package body include at least one first connection terminal 209 and 209' electrically connected to at least one core circuit 112 and 112' via the first interconnection structure 208, and at least one second connection terminal 207 electrically connected to one electrostatic discharge protection circuit 210 via the second interconnection structure 208'. The first lead 200 is configured on the package bodies 150, 160 and 170 and is electrically connected to the second connection terminal on the electrostatic discharge protection circuit 210 for electrically connecting to an external circuit. The second lead 202 is configured on the package body but separated from the first lead 200 in structure for interconnection of the first connection terminals 209 and 209' on the core circuits 112 and 112'.

Referring to the embodiments in FIGS. 4-6, for example, at least one connection terminal 209' of one of the first connection terminals is separated from the core circuit 112 in structure.

The package body, for example, may include individual core circuits 112 and 112' which are more than two, and the connection terminal 209' is on the core circuit 112'.

The aforementioned mainly relates to one chip package structure. However, if a plurality of chips needs to be connected via leads to achieve a multiple chip package, the aforementioned structures are also applicable.

Figure 7:
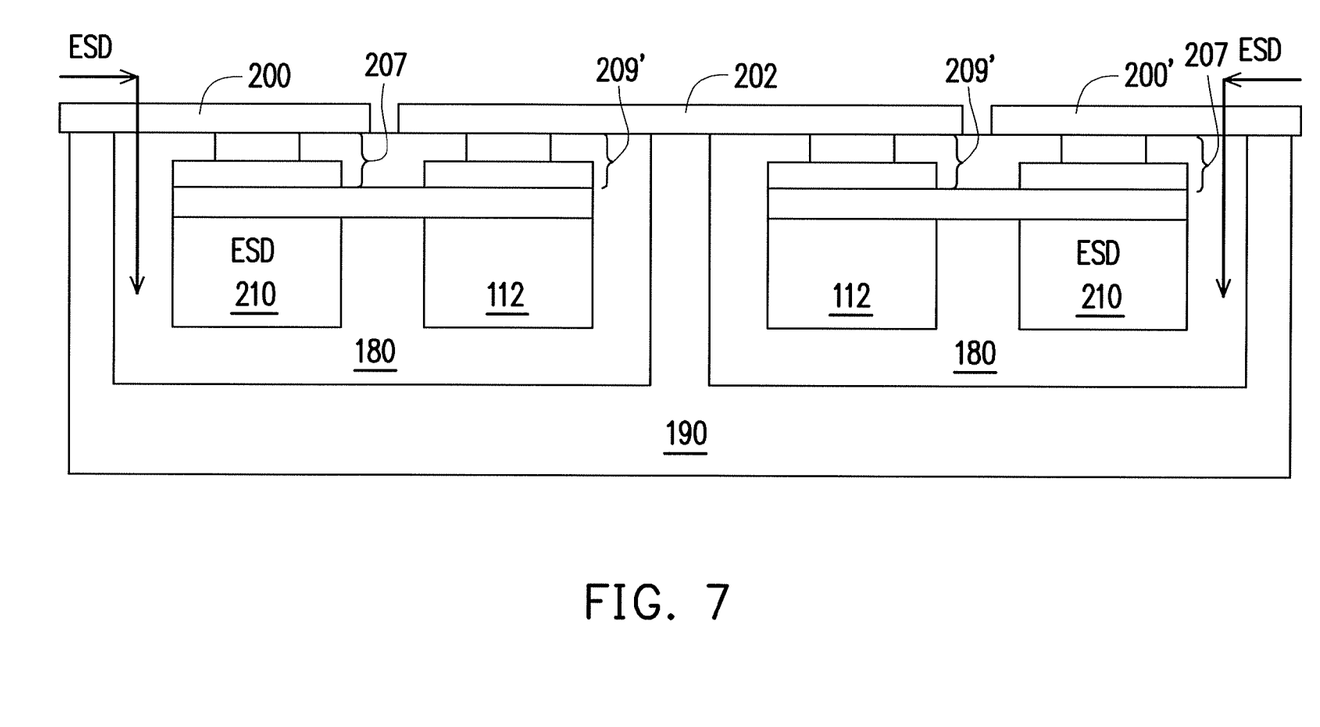
FIG. 7 is a cross-sectional schematic view of a chip package structure according to an embodiment of the invention.

In FIG. 7, a cross-sectional schematic view of a chip package structure according to an embodiment of the invention is illustrated. Refer to FIG. 7, which relates to a structure of a multiple chip package. A package including two chips is used as an example in the embodiment, although in actuality more chips may be included. The ESD protection circuit 210 and the core circuit 112 are embedded inside a chip package body 180. For example, a framework in FIG. 5 is used as a basis, although the other chips, such as the chips in FIGS. 4 and 6, may also be used as a basis.

In addition, the internal parts of the two chips packaged in the embodiment may be on the same basis as that in FIG. 5, although in actuality different frameworks as the embodiments in FIGS. 4 and 6 can also be used as a basis. The connection terminal 207 on the ESD protection circuit 210 is still electrically connected to the lead 200 to electrically connect to an external circuit. An ESD current is also likely to enter from the lead 200 or a lead 200', which are also referred to as outer leads. In the embodiment, the ESD current passes through the ESD protection circuit 210 first and thus the ESD current does not enter the core circuit 112. The lead 202, also referred to as an inner lead of the multiple chip package, may be used to connect outwardly from one chip to another chip while separated from the outer lead (e.g., the lead 200 or 200') of another chip, such that the ESD protection circuit 210 respectively protects the corresponding core circuits and the ESD current does not transmit through the inner lead to other chips.

In summary, a chip package structure includes a first chip, a second chip, an inner lead 202, and at least one outer lead 200. The inner lead 202 is configured on the package body 180 and is used for electrically connecting to the first chip and the second chip. In view of the first chip or the second chip, the outer lead 200 is configured on the package body 180 and is used for electrically connecting the first chip or the second chip to an external circuit (not shown). The inner lead 202 and the outer lead 200 are separate in structure.

At least one of the first chip and the second chip includes a package body 180. Elements embedded inside the package body 180 include the core circuit 112 having at least one connection terminal 209 and 209' as shown in FIGS. 4-6 thereon, the electrostatic discharge protection circuit 210 having at least one second connection terminal 207 thereon electrically connected to the outer lead 200, the inner lead 202 electrically connecting the first connection terminals 209 and 209', and at least one interconnection structure electrically connected to the second connection terminal 207 and the connection terminal 209'.

In addition, when necessary, the outer part of a package body further has an encapsulating layer 190 packaging two chips into a structure body.

Figure 8:
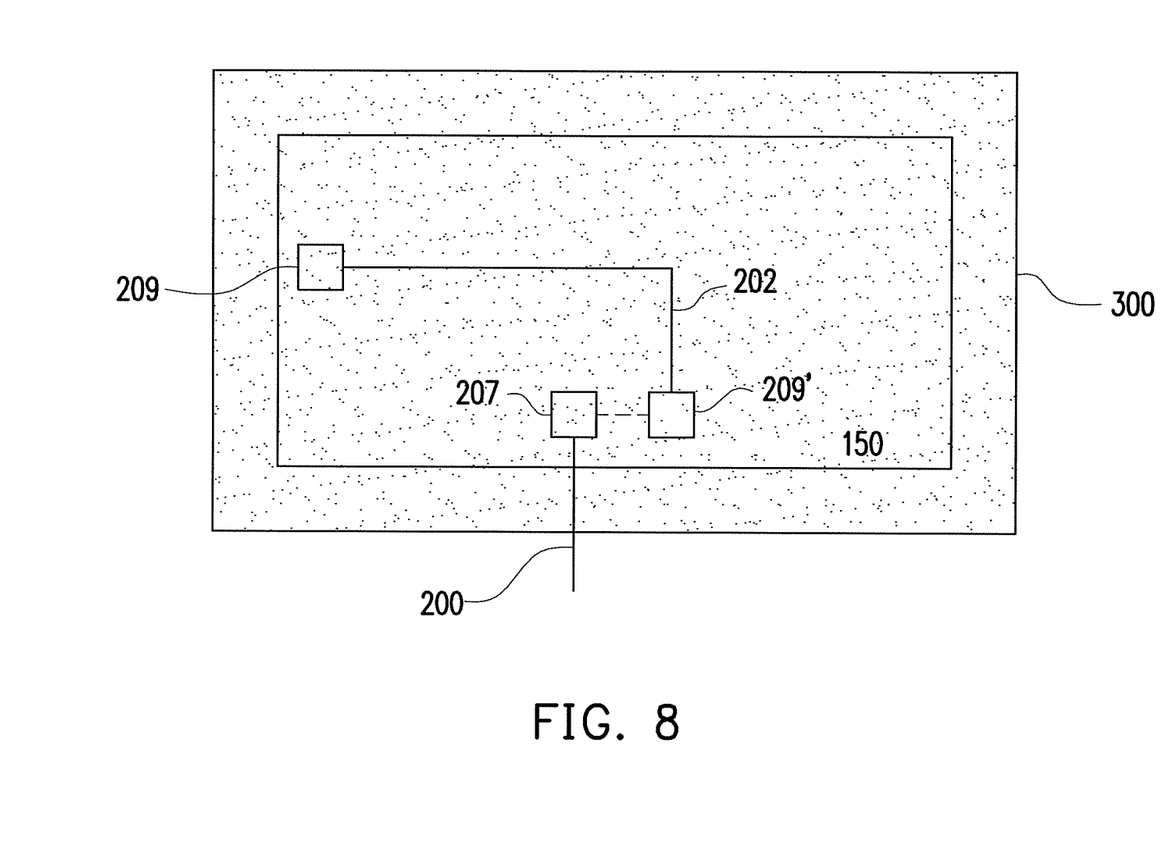
FIG. 8 is a top view of a chip package structure according to an embodiment of the invention.

In FIG. 8, a top view of a chip package structure according to an embodiment of the invention is illustrated. Referring to FIG. 8, the chip package body 150, as shown in FIG. 4, includes a relay connection structure 102', which is also the connection terminal 209'. Accordingly, an ESD current has no way to transmit to the connection terminal 209 on a surface of the package body 150 since the ESD current directly transmits to the ESD protect circuit after entering from the lead 200. In other words, the ESD current cannot transmit from the lead 200 to the lead 202 via the interconnection structure 208' shown by dotted lines and the relay connection structure 102' (shown as 209'). As a result, the ESD protection circuit 210 needs to be disposed only to the connection terminal electrically connected to the external circuit, e.g., the connection terminal 207. There is no need for the ESD protection circuit 210 to be disposed to every connection terminal such as 209.

Furthermore, the relay connection structure 102' (shown as 209') is likely to cause an uneven surface to increase on a surface and even cause electrical issues that rarely happen to increase. Nevertheless, generally a protection layer 300 is disposed on the surface to cover the connection terminals 207 and 209'. Therefore, increasing the connection structure 102' does not affect original circuits.

The invention provides a winding design of a film lead, which joins an inner film lead with an interconnection structure inside an integrated circuit after passing an ESD protection circuit, to replace conventional winding that uses a film lead at all. Therefore, the invention prevents the ESD from directly entering the next connection terminal after passing the previous connection terminal. Thereby, an ESD current passes an ESD protection circuit first and then is blocked and prevented from flowing directly into the next connection terminal; and a bottom thereof is connected to a core circuit. Accordingly, an area for the ESD protection circuit is saved for placement of more core circuits.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:
1. A chip package structure, comprising:
  a package body, comprising:
    a core circuit;
    an electrostatic discharge protection circuit;
    a first connection terminal electrically connected to the core circuit;
    a second connection terminal electrically connected to the electrostatic discharge protection circuit;
    a third connection terminal; and
    a first interconnection structure electrically connected to the electrostatic discharge protection circuit, the second connection terminal and the third connection terminal;
  a first lead electrically connecting the second connection terminal and an external circuit; and a second lead electrically connecting the first connection terminal and the third connection terminal,
wherein the second lead and the first lead are separate.

2. The chip package structure according to claim 1, further comprising:
a second interconnection structure electrically connected to the core circuit and the first connection terminal.

3. The chip package structure according to claim 1, wherein the first interconnection structure is further electrically connected to the core circuit and the first connection terminal.

4. The chip package structure according to claim 1, wherein the first connection terminal, the second connection terminal, and the third connection terminal comprise a connection pad and an electrical bump thereon, respectively.

5. The chip package structure according to claim 1, wherein the first lead and the second lead are power lead used for transmitting power.

6. A chip package structure, comprising:
a package body, comprising:
at least one first connection terminal electrically connected to a core circuit via a first interconnection structure;
at least one second connection terminal electrically connected to an electrostatic discharge protection circuit via a second interconnection structure; and
a third connection terminal electrically connected to the second interconnection structure;
a first lead electrically connected to the second connection terminal for connecting an external circuit; and
a second lead, separated from the first lead, electrically connecting the third connection terminal and the first connection terminal.

7. The chip package structure according to claim 6, wherein the second interconnection structure is further electrically connected to the core circuit and the first connection terminal.

8. The chip package structure according to claim 7, wherein the first interconnection structure and the second interconnection structure are integrated as a continuous interconnection structure.

9. The chip package structure according to claim 6, the first connection terminal, the second connection terminal, and the third connection terminal comprise a connection pad and an electrical bump thereon, respectively.

10. The chip package structure according to claim 6, wherein the first lead and the second lead are power lead used for transmitting power.

11. A chip package structure, comprising:
a package body comprising a core circuit and an electrostatic discharge protection circuit, and a connection structure;
a first lead electrically connected to the electrostatic discharge protection circuit and the connection structure; and
a second lead electrically connected to the core circuit and the connection structure,
wherein the connection structure is electrically connected between the first lead and the second lead and reduces an electrostatic discharge (ESD) current from transmitting though the second lead to the core circuit,
wherein the first lead and the second lead are separated.

12. The chip package structure according to claim 11, wherein the connection structure comprises:
a first connection terminal electrically connecting the core circuit and the second lead;
a second connection terminal electrically connecting the electrostatic discharge protection circuit and the first lead; and
a first interconnection structure electrically connected to the electrostatic discharge protection circuit and the second connection terminal.

13. The chip package structure according to claim 12, wherein the connection structure further comprises:
a second interconnection structure electrically connected to the core circuit and the first connection terminal.

14. The chip package structure according to claim 12, wherein the first interconnection structure is further electrically connected to the core circuit and the first connection terminal.

15. The chip package structure according to claim 11, wherein the first lead and the second lead are power lead for transmitting power.

16. A chip package structure, comprising:
a first chip;
a second chip;
an inner lead electrically connecting to the first chip and the second chip; and
an outer lead electrically connecting one of the first chip and the second chip to an external circuit, wherein the inner lead and the outer lead are separate in structure,
wherein at least one of the first chip and the second chip comprises a package body, comprising:
a core circuit;
an electrostatic discharge protection circuit;
a first connection terminal electrically connected to the core circuit;
a second connection terminal electrically connected to the electrostatic discharge protection circuit and the outer lead;
a third connection terminal, wherein the inner lead electrically connects the first connection terminal and the third connection terminal; and
a first interconnection structure electrically connected to the electrostatic discharge protection circuit, the second connection terminal and the third connection terminal.

17. The chip package structure according to claim 16, wherein the package body of at least one of the first chip and the second chip further comprises a second interconnection structure electrically connected to the core circuit and the first connection terminal.

18. The chip package structure according to claim 16, wherein the first interconnection structure further continuously electrically connected to the core circuit and the first connection terminal.

19. The chip package structure according to claim 16, wherein the first connection terminal, the second connection terminal, and the third connection terminal comprise a connection pad and an electrical bump thereon, respectively.

* * * * *